INVENTOR
STANLEY SCHENKERMAN
BY
Bosst and Bosst
ATTORNEYS

April 11, 1961 S. SCHENKERMAN 2,979,674

TRANSISTOR-MAGNETIC CORE PULSE WIDTH MODULATING AND AMPLIFYING DEVICE

Filed July 27, 1959 4 Sheets-Sheet 2

INVENTOR
STANLEY SCHENKERMAN
BY
Borst and Borst
ATTORNEYS

INVENTOR
STANLEY SCHENKERMAN
BY
Borst and Borst
ATTORNEYS

INVENTOR
STANLEY SCHENKERMAN
BY
Borst and Borst
ATTORNEYS

United States Patent Office 2,979,674
Patented Apr. 11, 1961

2,979,674

TRANSISTOR-MAGNETIC CORE PULSE WIDTH MODULATING AND AMPLIFYING DEVICE

Stanley Schenkerman, Forest Hills, N.Y., assignor to Sperry Rand Corporation, Ford Instrument Company Division, Wilmington, Del., a corporation of Delaware Filed July 27, 1959, Ser. No. 829,808
6 Claims. (Cl. 332—12)

This invention relates to direct current to alternating current converters particularly to converters of this type which employ transistors and saturable cores in their circuitry.

One object of the invention is to provide a solid state amplifier which is energized by a direct current source and is capable of summing several isolated direct current signals.

Another object of the invention is to provide a solid state amplifier energized by a direct current source and capable of summing, with isolation, several direct current or low frequency signals and giving an indication of such summation by means of pulse-width modulation in its output.

A further object of the invention is to provide a solid state amplifier which is designed to provide isolation of its load and permit minimum load current to be made zero.

Another object of the invention is to provide a solid state amplifier having fast transient response and zero parasitic or circulating currents in its control circuit.

Figures 2, 3, 3A:
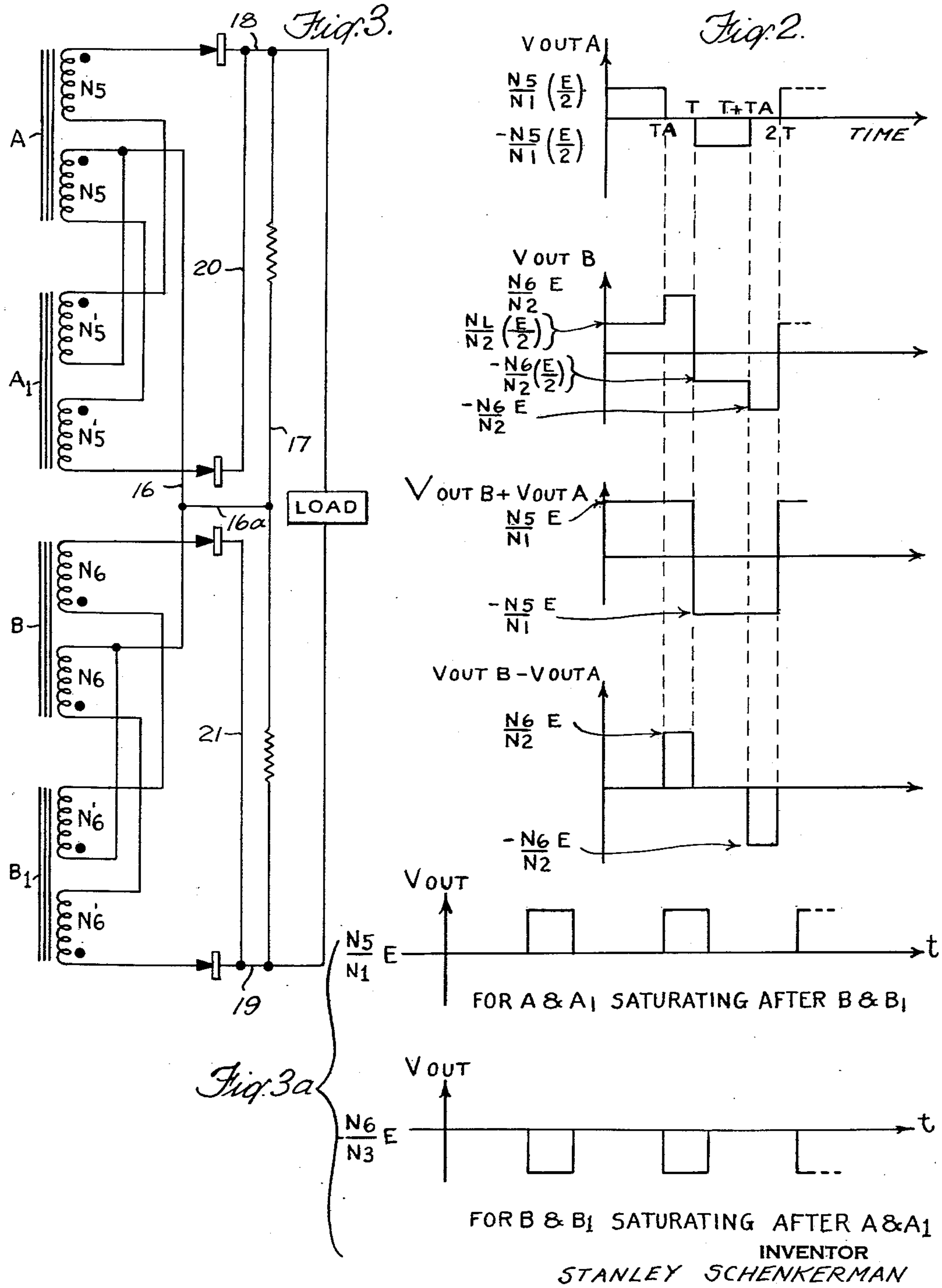
Figure 4:
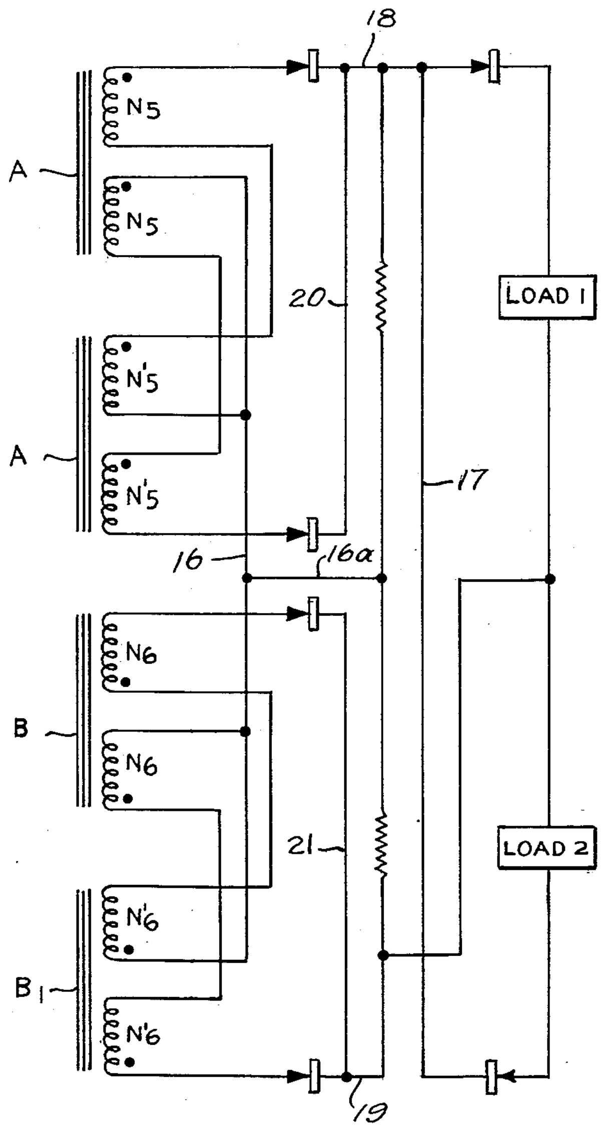
Figure 5:
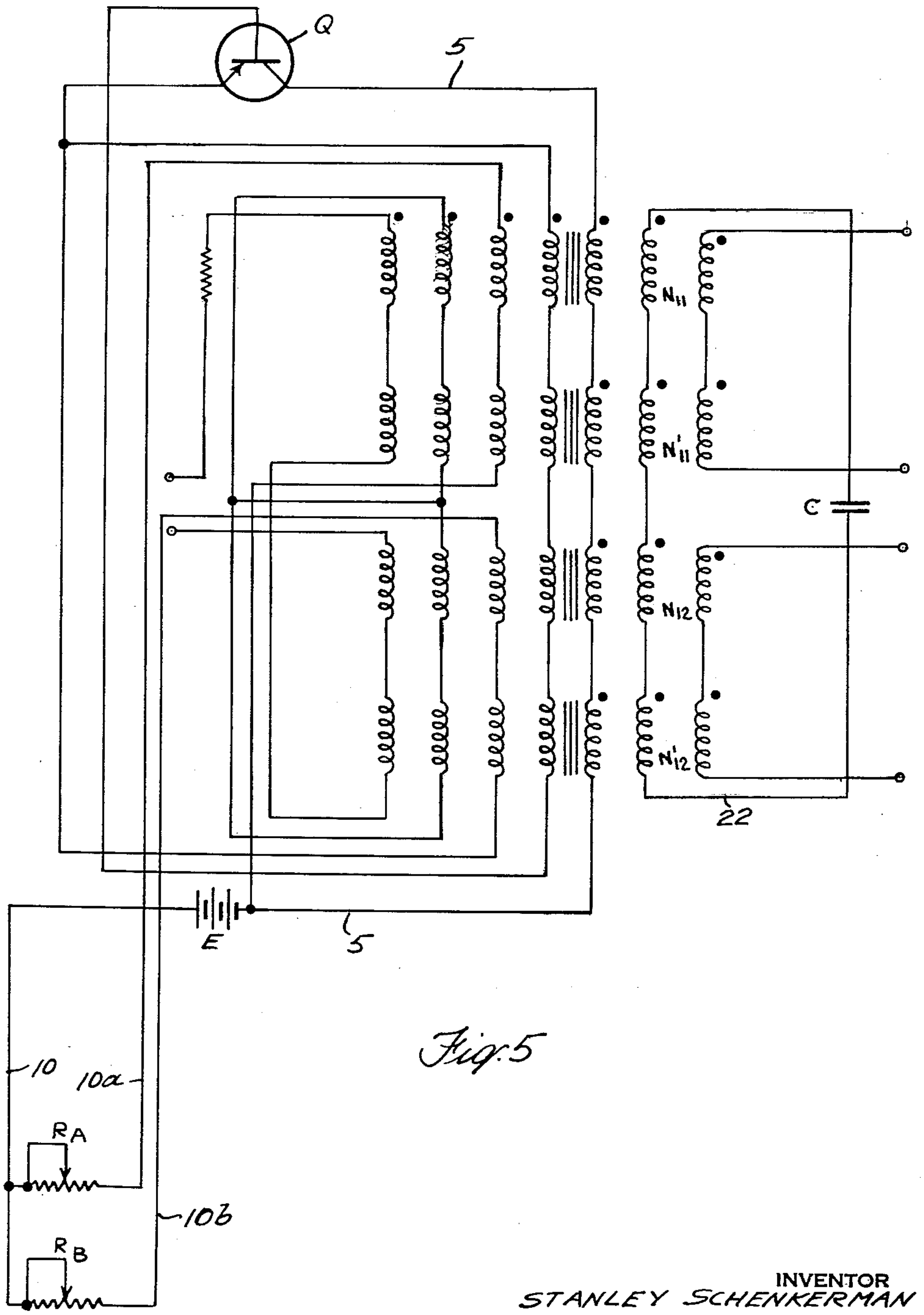

In general these objects are accomplished by a transistor-magnetic core pulse-width modulating and amplifying device in which there is disposed a pair of transistors each operating as control elements for separate core and coil assemblies. Further each transistor is disposed in a separate regenerative circuit and power circuit and the transistor is caused to be saturated by the regenerative circuit which in turn causes the full voltage of the power source for the amplifier to be placed across the coils of the power circuit. Voltages induced in the output circuits of the amplifier are controlled in accordance with the state of the transistors. Pulse width in these output circuits is a function of the time required to saturate the cores. The voltage of the amplifier is suitably controlled by choice of circuit parameters. There follows a more detailed description of the embodiments of invention taken in conjunction with the accompanying drawings, in which Fig. 1 is a schematic of the basic full wave amplifier circuit, Fig. 2 illustrates the output wave forms for the circuit shown in Fig. 1, Fig. 3 is a modification showing a differential full wave output circuit having a two terminal load which may replace the output circuit shown in Fig. 1, Fig. 3*a* illustrates the output wave form for the modified circuit shown in Fig. 2, Fig. 4 is a modification showing a schematic circuit in the output of the amplifier for driving gated loads, and Fig. 5 schematically illustrates a basic half wave-capacitor reset circuit.

Figure 1:
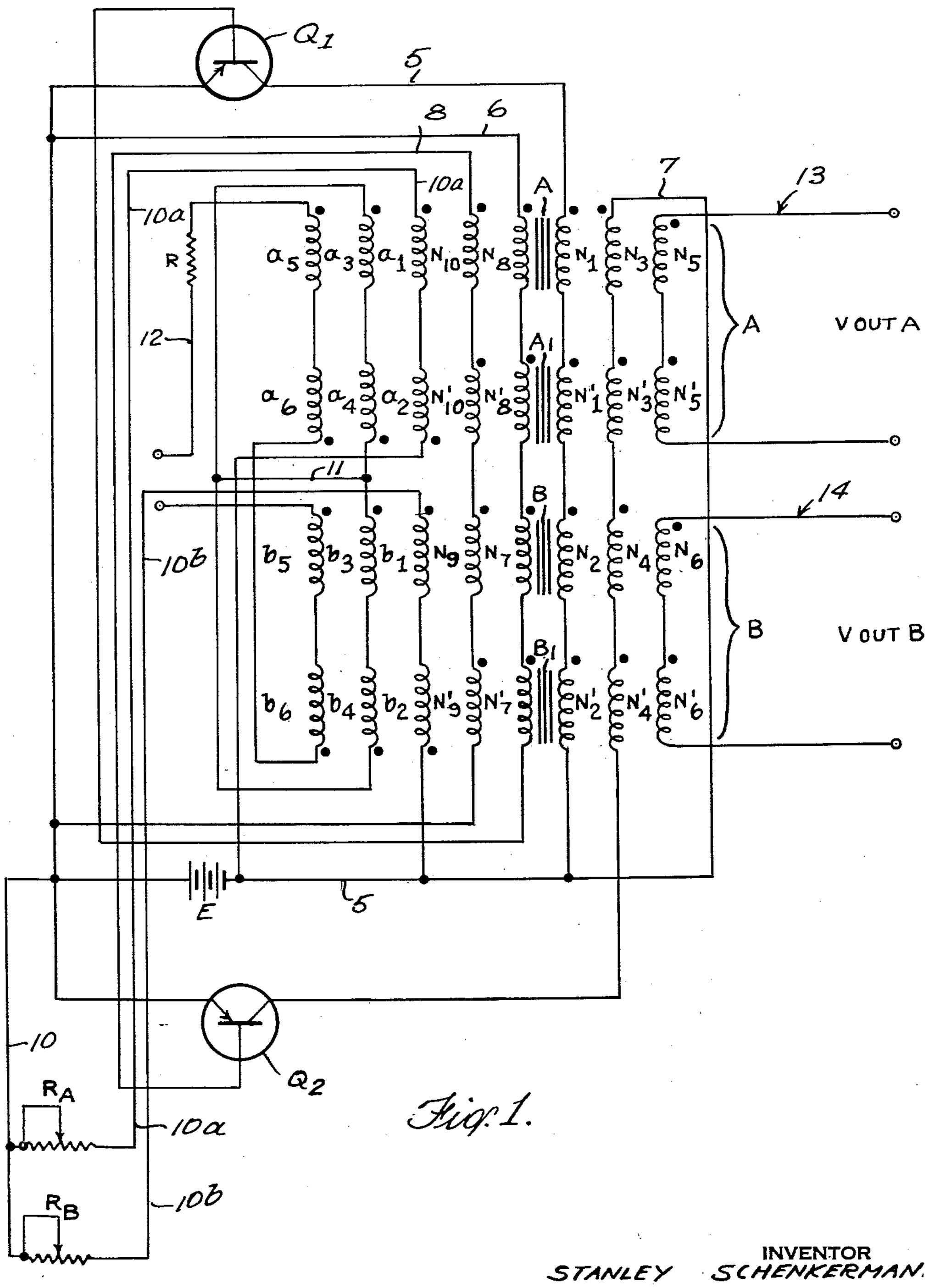

Referring to Fig. 1 the amplifier provides a pair of transistors $Q_1$ and $Q_2$ and two pairs of cores A and $A_1$, B and $B_1$.

Power circuit 5 of the transistor $Q_1$ is connected to the collector electrode and includes series connected windings $N_1$ and $N_1'$ arranged on the cores A and $A_1$, respectively, and series connected windings $N_2$ and $N_2'$ arranged on the cores B and $B_1$, respectively. The other side of the winding $N_2'$ is connected through the battery source E to the emitter electrode of the transistor $Q_1$.

Regenerative circuit 6 of the transistor $Q_1$ is connected between the emitter and base electrodes thereof and includes the series connected windings $N_8$ and $N_8'$ arranged on the cores A and $A_1$, respectively, and the series connected windings $N_7$ and $N_7'$, arranged on the cores B and $B_1$, respectively.

The power circuit 7 for the transistor $Q_2$ is also connected between the collector and emitter electrodes thereof and includes the series connected windings $N_3$ and $N_3'$ arranged on the cores of A and $A_1'$, respectively, and the series connected windings $N_4$ and $N_4'$ arranged on the cores of B and $B_1$, respectively. The power circuit 7 also includes the battery source E. The regenerative circuit 8 for the transistor $Q_2$ is connected between the base and emitter electrodes thereof and includes the windings $N_{10}$ and $N_{10}'$ arranged on the cores A and $A_1$, respectively, and the windings $N_9$ and $N_9'$ arranged on the cores B and $B_1$, respectively.

Bias circuit 10 of the amplifier is connected across battery source E and includes two parallel branches 10*a* and 10*b*. The bias branch 10*a* includes in series the rheostat $R_A$ and windings $a_1$ and $a_2$ oppositely poled and arranged on the cores A and $A_1$, respectively. The bias branch 10*b* includes the windings $b_1$ and $b_2$ which are arranged on the cores B and $B_1$ and are also oppositely poled.

The cores A and $A_1$ have disposed thereon coils $a_3$ and $a_4$, respectively, which are oppositely poled and shorted by a low resistance conductor 11 while the cores B and B′ have disposed thereon coils $b_3$ and $b_4$, respectively, which are also oppositely poled and shorted by the conductor 11.

Control circuit 12 includes the resistor R and two pairs of oppositely poled, series connected coils, viz. $a_5$ and $a_6$ disposed respectively on the cores A and $A_1$ and the coils $b_5$ and $b_6$ arranged on the cores B and $B_1$, respectively.

As shown in Fig. 1, there are two output circuits, 13 for the cores A and $A_1$ including windings $N_5$ and $N_5'$ arranged on those respective cores and output circuit 14 including windings $N_6$ and $N_6'$ arranged on the cores B and $B_1$, respectively.

There is shown in Fig. 3 a modified output circuit for the basic amplifier described above. In accordance therewith the output windings $N_5$ and $N_5'$ and the output windings $N_6$ and $N_6'$ are connected in series opposition and are effectively center tapped by a lead 16 which is connected by a lead 16*a* to a voltage divider 17 which is connected to the rectified output conductors 18 and 19 thereby being placed across the output coils. The untapped side of coil $N_5'$ and coil $N_6$ are connected by rectified leads 20 and 21 to the output leads 18 and 19, respectively to assure a full wave output for the amplifier.

The circuit of Figure 1 operates in the following manner:

Assuming that the control circuit and bias circuit currents are zero and that the transistor $Q_1$ has just started to conduct, the current flowing through the windings $N_1$, $N_1'$, $N_2$ and $N_2'$ causes all the windings to be positive at their dotted end as shown in the drawing. The induced voltages across the windings $N_7$, $N_7'$, $N_8$ and $N_8'$ are in a direction to increase the conduction of transistor $Q_1$. Thus, the circuit 6 regenerates until the transistor $Q_1$ is saturated. This occurs very rapidly. During this time the induced voltage in the regenerative circuit 8 keeps the transistor $Q_2$ cut off. When the transistor is in saturaton, its impedance is very small and for this discussion it is considered to be zero. On the other hand when the transistor is cut off, its impedance is sufficiently high so that it may be considered an open circuit. With the transistor $Q_1$ saturated, the supply voltage E is placed across the windings in the anode circuit 5. Because the windings have the same number of turns, and the cores are similar, the voltage divides equally between the coil assemblies. Where the number of turns of each coil assembly in the anode circuit 5 is N, where $N_1+N_1'=N_2+N_2'=N$, then the time, T', required for passing from negative to positive core saturation or vice versa in the saturable cores is $$\frac{2N\phi_m}{E}$$

where $\phi_m$ is the maximum flux excursion which can be attained in each core. When core saturation is reached, the current through the windings of the power circuit 5 increases rapidly in an effort to maintain the rate of flux change. However, the current is limited by the base-emitter drive of the transistor $Q_1$ which is applied by the regenerative circuit 6. Since the required current can be supplied no longer, the induced voltages in all windings drop to zero turning off the transistor $Q_1$. The core flux now drops towards its residual value inducing voltages of the opposite polarity in all windings, their dotted ends now becoming negative. The transistor $Q_2$ then regenerates and its half cycle operation is as explained for the transistor $Q_1$. The circuit thus operates astably inducing essentially square wave voltages in the output circuits 13 and 14. If the output circuits 13 and 14 were connected in series opposition, the voltage output would be zero.

The shorted coil turns $a_3$ and $a_4$ for the A core assembly and the shorted coil turns $b_3$ and $b_4$ for the B core assembly assure that when either of the cores saturates the inductance of the respective coil assembly drops to zero.

That the amplifier provides pulse width modulation is demonstrable as follows:

Assuming that the rheostats $R_A$ and $R_B$ are adjusted with current flow in the bias windings of the magnitudes necessary to limit the total flux excursions of each core to, for example, one half of what they are with zero bias currents, then the effect will be to double the frequency since the time required to saturate the cores is halved. Where the anode windings of each coil assembly have N turns were $N_1+N_1'=N_2+N_2'=N$, and $\phi_s$ denoted the (saturation) flux excursion of the cores, each half period becomes $$\frac{2N\phi_s}{E}$$

As shown in Fig. 1 the control windings $a_5$ and $a_6$ are arranged to have the same polarity as the bias windings on the cores A and $A_1$ while the windings $b_6$ and $b_5$ are arranged to have opposite polarity to their associated bias windings. Therefore when a control curent I is permitted to flow in the control circuit 12, this current will aid the bias for the coil assembly A and oppose for coil assembly B. Denote the change in flux excursion in each core by $\Delta\phi$. The flux excursion $\phi_A$ for coil assembly A will be $\phi_s-\Delta\phi$ and the flux excursion $\phi_B$ for coil assembly B will be $\phi_s+\Delta\phi$. It is, therefore, seen that it will require less time to saturate the A coil assembly than the B coil assembly and, since the duration of the output pulses is related to the time required to saturate the cores, it becomes apparent that the duration of the pulses is a function of the amplitude of the control current. However the total period of the oscillating frequency is independent of the control current. The output voltage will be a series of positive and negative pulses as shown in Fig. 2 which indicates the wave form for the output of each core assembly as well as the combined output of the two core assemblies.

The ampere turns in the control circuit is the critical variable for the controlling of the pulse width for the output pulses. Consequently, it may be seen that several control circuits, which are isolated from each other, may be simultaneously employed and the change in pulse width of the output pulses will afford an indication of the algebraic sum of the applied control signals. It will be noted that no induced voltages apear in either the control or bias circuits because of the opposing polarity on the windings of each core.

The transient response is less than a half cycle of the oscillating frequency. This is evident when it is realized that all cores are simultaneously saturated during some portion of each half cycle. The control circuit inductance is then zero. The control current is then established by the input voltage and the control circuit resistance. Since the flux follows the current, half cycle response is assured.

If a full wave rectifier (not shown) is disposed across the voltage divider 17 in the output circuit shown in Fig. 3 no reversal of the output polarity can occur, but the average output voltage $V_o$ may be given by the following expression:

$$V_o=\frac{N_6}{N_2}E\frac{\Delta\phi}{\phi_s}$$

Since, in the linear region, $$\frac{\Delta\phi}{\phi_s} \text{ is equal to } \frac{IN_C}{I_BN_B}$$

where $N_C$ and $N_B$ are the number of turns in the control and bias circuits, respectively, and $I_B$ is the bias current, the expression for $V_o$ can be placed in the following form:

$$\frac{N_6}{N_2}E\frac{N_C}{I_BN_B}I$$

This expression for output voltage $V_o$ indicates that the output voltage is a function of the signal current, I, and its amplitude is subject to modulation by the input signal strength in the control circuit 12.

There is shown in Fig. 4 an output circuit which is similar to the output circuit which is shown in Fig. 3 but which is slightly modified for the purpose of illustrating how two loads 1 and 2 may be connected into the output circuit and gated on and off in accordance with the polarity of the signal in the control circuit 12. The same character reference numerals are given to identical components in the two forms of output circuit. In addition, a second half wave rectifier is placed in the output lead 18 and poled in the direction of the load 1 which is disposed between the output leads 18 and 19. The load 2 is similarly connected between the output leads 18 and 19, the load connection for this load having a half wave rectifier poled away from the load 2. In operation it may be seen that the load 1 is energized for control signals which have a polarity such that the coil assembly B is saturated before the coil assembly A. On the other hand the load 2 is energized for control signals of the opposite polarity.

A single transistor half wave circuit is shown in Fig. 5 and, as shown therein, operates similarly to the full cycle circuit shown in Fig. 1 except for the fact that there is a single transistor which requires one anode and regenerative circuit. The bias, control, output and shorted turn circuits are the same as shown in Fig. 1 and have been assigned the same reference numerals as have the various components of the anode and regenerative circuits. In addition, a capacitor reset circuit 22 is provided having windings $N_{11}$ and $N_{11}'$ on cores A and $A_1$ and similarly wound series windings $N_{12}$ and $N_{12}'$ on cores B and $B_1$ and a capacitor C placed across the entire winding assembly for the reset circuit. The gating cycle, which occurs while the transistor Q is on, is the same as for the full wave circuit. At the beginning of the gating cycle capacitor C is rapidly charged up. The voltage across C remains constant during the remainder of the gating cycle and no additional current flows in the reset circuit during this time. When all cores saturate and the induced voltages reverse, current flows in the reset circuit in the direction to discharge C and recharge it with the opposite polarity. This occurs very rapidly because of the low (saturated) winding impedances. The capacitor now discharges back through the windings resetting all cores. The reset time is independent of control signal.

Various other modifications of the invention may be effected by persons skilled in the art without departing from the principle and scope of the invention as defined in the appended claims.

What is claimed is:

1. A transistor-magnetic core pulse width modulating and amplifying device comprising a transistor having a base, emitter and collector electrodes, two pairs of saturable cores, an anode or power circuit connected across said emitter and collector electrodes, said anode circuit comprising a pair of similarly poled windings separately arranged on one pair of cores, a second pair of similarly poled windings arranged on the other pair of cores and a direct current voltage source, a regenerative circuit connected across the base and emitter electrodes of said transistor, said regenerative circuit comprising a pair of similarly poled windings on one pair of saturable cores and a second pair of similarly poled windings arranged on the second pair of saturable cores, a control circuit coupled to each pair of the saturable cores, a second transistor having base, emitter and collector electrodes, a second anode or power circuit having windings arranged on said two pairs of saturable cores similarly to the arrangement of the windings of said first-mentioned anode circuit, said second anode circuit including said direct current voltage source and connected across the emitter electrodes of said second transistor, a second regenerative circuit connected across the base and emitter electrodes of said second transistor, said second regenerative circuit having two pairs of windings arranged on the two pairs of saturable cores in a manner similar to the windings in said first-mentioned regenerative circuit, a bias circuit coupled by means of bias windings to each pair of the saturable cores, the bias windings on one pair of saturable cores having the same polarity as the control windings on those cores and the bias windings on the other pair of saturable cores having a polarity opposite to the control windings on said second pair of saturable cores and an output circuit coupled to said saturable cores.

2. A transistor-magnetic core pulse width modulating and amplifying device comprising a transistor having a base, emitter and collector electrodes, two pairs of saturable cores, an anode or power circuit connected across said emitter and collector electrodes, said anode circuit comprising a pair of similarly poled windings separately arranged on one pair of cores, a second pair of similarly poled windings arranged on the other pair of cores and a direct current voltage source, a regenerative circuit connected across the base and emitter electrodes of said transistors, said regenerative circuit comprising a pair of similarly poled windings on one pair of saturable cores and a second pair of similarly poled windings arranged on the second pair of saturable cores, a control circuit coupled to each pair of the saturable cores, a second transistor having base, emitter and collector electrodes, a second anode or power circuit having windings arranged on said two pairs of saturable cores similarly to the arrangement of the arrangement of the windings of said first-mentioned anode circuit, said second anode circuit including said direct current voltage source and connected across the emitter electrodes of said second transistor, a second regenerative circuit connected across the base and emitter electrodes of said second transistor, said second regenerative circuit having two pairs of windings arranged on the two pairs of saturable cores in a manner similar to the windings in said first-mentioned regenerative circuit, a bias circuit coupled by means of bias windings to each pair of the saturable cores, the bias windings on one pair of saturable cores having the same polarity as the control windings on those cores and the bias windings on the other pair of saturable cores having a polarity opposite to the control windings on said second pair of saturable cores, a shorted turn circuit coupled to each pair of the saturable cores, and an output circuit coupled to said saturable cores.

3. An amplifier as claimed in claim 2 wherein the windings of each pair of windings in said bias, control and shorted turn circuits are oppositely poled whereby induced voltages in said latter circuits are prevented.

4. An amplifier as claimed in claim 3 wherein the output circuit thereof comprises four pairs of output windings with each pair wound separately on one of said saturable cores, the output windings on one pair of cores being poled oppositely to the output windings on the other pair of cores, a voltage divider connected across all of said output windings, a conductor effectively center tapping said windings and said voltage divider, each side of one of the pairs of output windings on one pair of cores being similarly rectified and connected to one side of said voltage divider and each side of said other pair of output windings on one pair of said other cores being similarly rectified and being connected to the other side of said voltage divider and a single load connected across the output of said voltage divider.

5. An amplifier as claimed in claim 4 wherein a half wave rectifier is disposed in the lead connecting said load across the output of said voltage divider and a second load is connected across the output of said voltage divider and a second half wave rectifier is disposed in said second load connection, said second half wave rectifier being poled oppositely to said first-mentioned half wave rectifier whereby said loads are adapted to be gated on and off in accordance with the polarity of the current in said control circuit.

6. An amplifier as claimed in claim 3 wherein there is provided a reset circuit, said reset circuit comprising a pair of similarly poled windings on one pair of said saturable cores, a second pair of similarly poled windings on said second pair of saturable cores and a capacitor connected across the two pairs of reset windings.

References Cited in the file of this patent

UNITED STATES PATENTS

| | | |
|---|---|---|
| 2,849,614 | Royer | Aug. 26, 1958 |
| 2,886,763 | Zelina | May 12, 1959 |